US009563384B2

(12) United States Patent
Berke et al.

(10) Patent No.: US 9,563,384 B2
(45) Date of Patent: *Feb. 7, 2017

(54) SYSTEMS AND METHODS FOR DATA ALIGNMENT IN A MEMORY SYSTEM

(71) Applicant: Dell Products L.P., Round Rock, TX (US)

(72) Inventors: Stuart Allen Berke, Austin, TX (US); Bhyrav M. Mutnury, Round Rock, TX (US); Vadhiraj Sankaranarayanan, Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/206,827

(22) Filed: Jul. 11, 2016

(65) Prior Publication Data

US 2016/0321014 A1 Nov. 3, 2016

Related U.S. Application Data

(63) Continuation of application No. 14/667,356, filed on Mar. 24, 2015, now Pat. No. 9,417,802.

(51) Int. Cl.
*G06F 12/00* (2006.01)
*G06F 3/06* (2006.01)

(52) U.S. Cl.
CPC .......... *G06F 3/0659* (2013.01); *G06F 3/0611* (2013.01); *G06F 3/0635* (2013.01); *G06F 3/0653* (2013.01); *G06F 3/0683* (2013.01)

(58) Field of Classification Search
USPC ........................................................ 711/167
See application file for complete search history.

(56) References Cited

U.S. PATENT DOCUMENTS

2014/0281328 A1 9/2014 Pandey et al.

*Primary Examiner* — Jared Rutz
*Assistant Examiner* — Hamdy S Ahmed
(74) *Attorney, Agent, or Firm* — Jackson Walker L.L.P.

(57) ABSTRACT

A method may include link training a plurality of back-side lanes coupling a plurality of memory chips of a memory module to a plurality of data buffers of the memory module. The method may also include link training a plurality of front-side lanes coupling the plurality of data buffers to a memory controller. The method may further include determining after link training of the back-side and front-side lanes whether signal integrity of data communicated over the front-side lanes exceeds one or more thresholds. The method may additionally include responsive to determining that the signal integrity of data communicated over one or more of the front-side lanes fails to exceed the one or more thresholds, modifying timing of data communicated over one or more of the back-side and front-side lanes in order to improve signal integrity of the one or more of the front-side lanes failing to exceed the thresholds.

15 Claims, 3 Drawing Sheets

SYSTEMS AND METHODS FOR DATA ALIGNMENT IN A MEMORY SYSTEM

The present patent application is a continuation of a previously filed patent application, U.S. patent application Ser. No. 14/667,356, filed Mar. 24, 2015, the entirety of which is hereby incorporated by reference.

TECHNICAL FIELD

The present disclosure relates in general to information handling systems, and more particularly to systems and methods for improvement of performance and signal integrity in memory systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often use memories to store data, either temporarily in volatile memory or in a quasi-permanent basis in non-volatile memory. To utilize such memory, memory modules are often coupled to a processor or controller via one or more buses and interfaces. Many types of memory, including double data rate (DDR) memory, are commonly implemented using single-ended (as opposed to differential) multi-drop buses. A multi-drop bus (sometimes abbreviated "MDB") is a communications bus in which all components are coupled to the same set of electrical wires or traces. Multi-drop buses are preferable in many applications as they often have the advantage of simplicity, scalability, and extensibility.

Single-ended communication links are often advantageous over differential links as they require half of the routing space (including package pins and balls) of differential links. However, single-ended links are often more sensitive to capacitive coupling to other links, which may also be known as crosstalk. Crosstalk can lead to signal jitter and/or other signal degradation. The problem of crosstalk increases with increasing signal speeds, thus potentially limiting attainable operating frequencies for single-ended links.

SUMMARY

In accordance with the teachings of the present disclosure, the disadvantages and problems associated with capacitive coupling and/or other sources of signal degradation in a communication link may be reduced or eliminated.

In accordance with embodiments of the present disclosure, a memory system may include a memory controller and a memory module communicatively coupled to the memory controller, the memory module comprising a plurality of memory chips configured to store data and a plurality of memory buffers communicatively coupled to the plurality of memory chips via a plurality of back-side lanes and communicatively coupled to the memory controller via a plurality of front-side lanes. At least one of the memory controller and the memory module may be configured to, alone or in concert with the other, link train the back-side lanes, link train the front-side lanes, determine after link training of the back-side lanes and the front-side lanes whether signal integrity of data communicated over each of the front-side lanes exceeds one or more thresholds, and responsive to determining that the signal integrity of data communicated over one or more of the front-side lanes fails to exceed the one or more thresholds, modify timing of data communicated over one or more of the back-side lanes and the front-side lanes in order to improve signal integrity of the one or more of the front-side lanes failing to exceed the one or more thresholds.

In accordance with these and other embodiments of the present disclosure, a method may include link training a plurality of back-side lanes communicatively coupling a plurality of memory chips integral to a memory module to a plurality of data buffers integral to the memory module. The method may also include link training a plurality of front-side lanes communicatively coupling the plurality of data buffers to a memory controller. The method may further include determining after link training of the back-side lanes and the front-side lanes whether signal integrity of data communicated over each of the front-side lanes exceeds one or more thresholds. The method may additionally include responsive to determining that the signal integrity of data communicated over one or more of the front-side lanes fails to exceed the one or more thresholds, modifying timing of data communicated over one or more of the back-side lanes and the front-side lanes in order to improve signal integrity of the one or more of the front-side lanes failing to exceed the one or more thresholds.

In accordance with these and other embodiments of the present disclosure, an information handing system may include a processor and a memory system. The memory system may include a memory controller and a memory module communicatively coupled to the memory controller, the memory module comprising a plurality of memory chips configured to store data and a plurality of memory buffers communicatively coupled to the plurality of memory chips via a plurality of back-side lanes and communicatively coupled to the memory controller via a plurality of front-side lanes. At least one of the memory controller and the memory module may be configured to, alone or in concert with the other, link train the back-side lanes, link train the front-side lanes, determine after link training of the back-side lanes and the front-side lanes whether signal integrity of data communicated over each of the front-side lanes exceeds one or more thresholds, and responsive to determining that the signal integrity of data communicated over one or more of the front-side lanes fails to exceed the one or more thresholds, modify timing of data communicated over one or more of the back-side lanes and the front-side lanes in order to improve signal integrity of the one or more of the front-side lanes failing to exceed the one or more thresholds.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
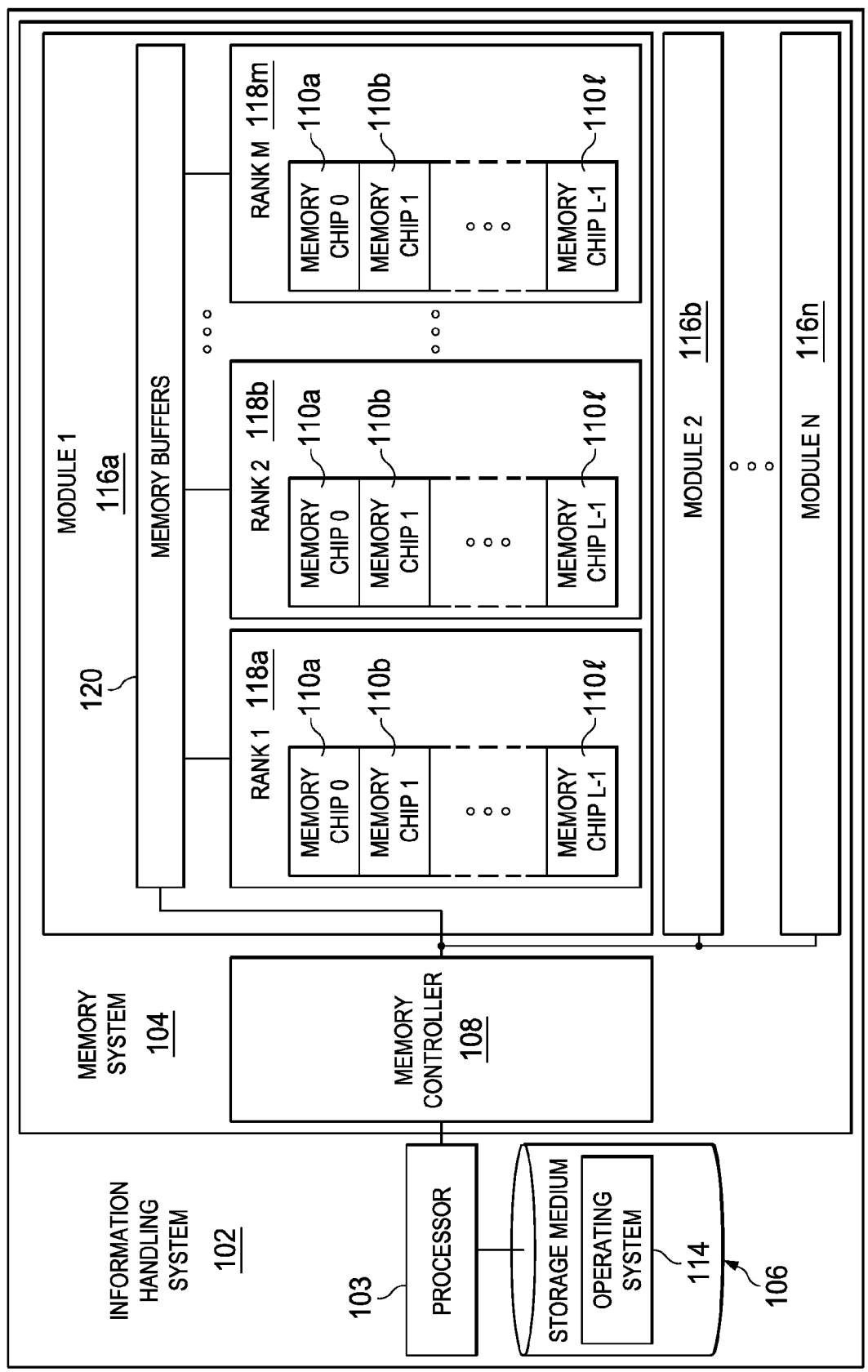
FIG. 1 illustrates a block diagram of an example information handling system in accordance with embodiments of the present disclosure.
Figure 2:
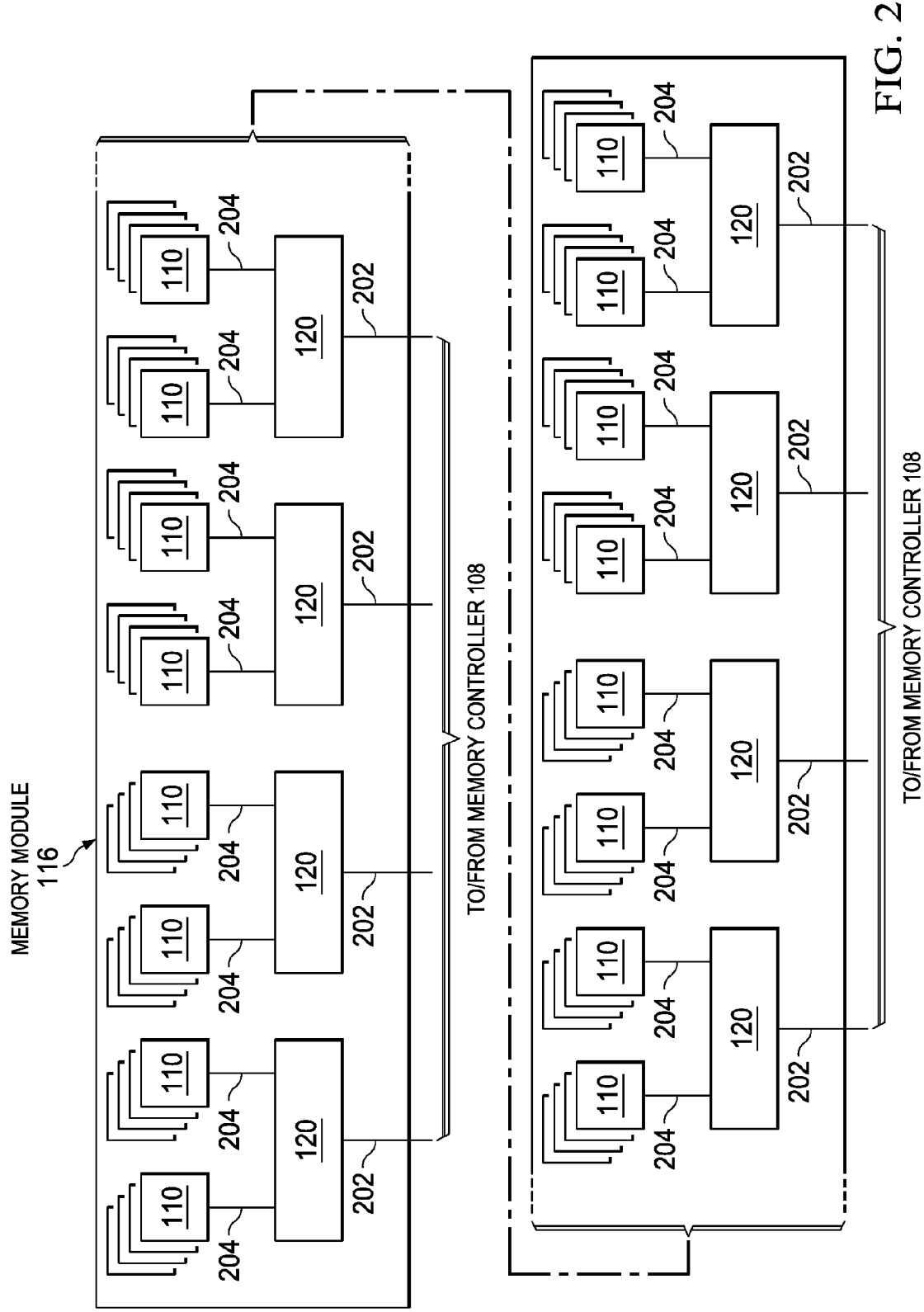
FIG. 2 illustrates a block diagram providing details of an example memory architecture for a memory module, in accordance with embodiments of the present disclosure.
Figure 3:
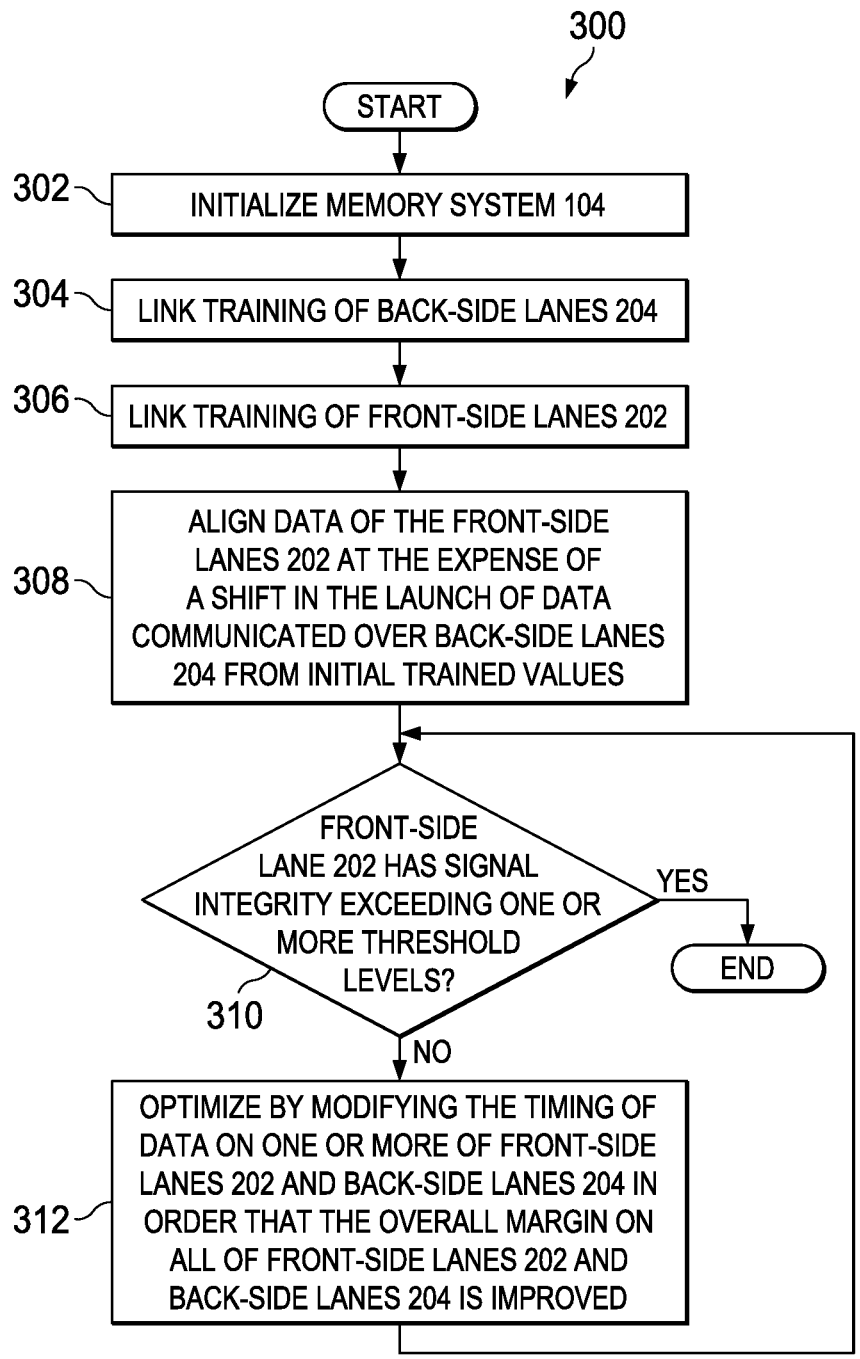
FIG. 3 illustrates a flow chart of an example method for data alignment in a memory system, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102 in accordance with certain embodiments of the present disclosure. In certain embodiments, information handling system 102 may comprise a computer chassis or enclosure (e.g., a server chassis holding one or more server blades). In other embodiments, information handling system 102 may be a personal computer (e.g., a desktop computer or a portable computer). As depicted in FIG. 1, information handling system 102 may include a processor 103, a memory system 104 communicatively coupled to processor 103, and a storage medium 106 communicatively coupled to processor 103.

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored and/or communicated by one or more of memory system 104, storage medium 106, and/or another component of information handling system 102.

Memory system 104 may be communicatively coupled to processor 103 and may comprise any system, device, or apparatus operable to retain program instructions or data for a period of time (e.g., computer-readable media). Memory system 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory system 104 may comprise dynamic random access memory (DRAM).

As shown in FIG. 1, memory system 104 may include memory controller 108 and one or more memory modules 116a-116n communicatively coupled to memory controller 108. Memory controller 108 may be any system, device, or apparatus configured to manage and/or control memory system 104. For example, memory controller 108 may be configured to read data from and/or write data to memory modules 116 comprising memory system 104. Additionally or alternatively, memory controller 108 may be configured to refresh memory modules 116 and/or memory chips 110 thereof in embodiments in which memory system 104 comprises DRAM. Although memory controller 108 is shown in FIG. 1 as an integral component of memory system 104, memory controller 108 may be separate from memory system 104 and/or may be an integral portion of another component of information handling system 102 (e.g., memory controller 108 may be integrated into processor 103).

Each memory module 116 may include any system, device or apparatus configured to retain program instructions and/or data for a period of time (e.g., computer-readable media). A memory module 116 may comprise a dual in-line package (DIP) memory, a dual-inline memory module (DIMM), a Single In-line Pin Package (SIPP) memory, a Single Inline Memory Module (SIMM), a Ball Grid Array (BGA), or any other suitable memory module. In some embodiments, memory modules 116 may comprise double data rate (DDR) memory.

As depicted in FIG. 1, each memory module 116 may include memory buffers 120 and memory chips 110 organized into one or more ranks 118a-118m. A memory buffer 120 may include computer-readable media interfaced between memory controller 108 and individual memory chips 110 to temporarily store data communicated between memory controller 108 and memory chips 110. For example, memory modules 116 may comprise load-reduced DIMMs (LR-DIMMs) having front-side data lanes coupling memory controller 108 to memory buffers 120 and back-side data lanes coupling memory buffers 120 to memory chips 110, as described in more detail below with respect to FIG. 2. LR-DIMM buffers may transfer data from front-side lanes to back-side lanes and vice versa using a small number of pipeline stages and clock alignment circuitry that are trained and calibrated to provide a fixed propagation delay without storing data.

In alternate embodiments, memory buffers 120 may be physically included within the packages of memory chips 110, such as, for example, on 3 Dimensional Thru-Silicon Via (3D TSV) based memory modules. In some other embodiments, memory buffers 120 may be implemented on System On Chip (SOC) packages, Package on Package (PoP), or any other suitable multi-chip package. In these and other embodiments, memory buffers 120 and memory chips 110 may all physically reside within a single multi-chip package or assembly.

In some embodiments, memory modules 116 may be communicatively coupled to memory controller 108 via a multi-drop bus having a plurality of single-ended communication links, each link coupled between memory controller 108 and a plurality of memory modules 116.

Each memory rank 118 within a memory module 116 may be a block or area of data created using some or all of the memory capacity of the memory module 116. In some embodiments, each rank 118 may be a rank as such term is defined by the JEDEC Standard for memory devices. As shown in FIG. 1, each rank 118 may include a plurality of memory chips 110. Each memory chip 110 may include one or more dies for storing data. In some embodiments, a memory chip 110 may include one or more dynamic random access memory (DRAM) dies. In other embodiments, a memory chip 110 die may comprise flash, Spin-Transfer Torque Magnetoresistive RAM (STT-MRAM), Phase Change Memory (PCM), ferro-electric memory, memristor memory, or any other suitable memory device technology.

Storage medium 106 may be communicatively coupled to processor 104. Storage medium 106 may include any system, device, or apparatus operable to store information processed by processor 103. Storage medium 106 may include, for example, network attached storage, one or more direct access storage devices (e.g., hard disk drives), and/or one or more sequential access storage devices (e.g., tape drives). As shown in FIG. 1, storage medium 106 may have stored thereon an operating system (OS) 114. OS 114 may be any program of executable instructions, or aggregation of programs of executable instructions, configured to manage and/or control the allocation and usage of hardware resources such as memory, CPU time, disk space, and input and output devices, and provide an interface between such hardware resources and application programs hosted by OS 114. Active portions of OS 114 may be transferred to memory 104 for execution by processor 103.

In addition to processor 103, memory system 104, and storage medium 106, information handling system 102 may include one or more other information handling resources.

FIG. 2 illustrates a block diagram providing details of an example memory architecture for a memory module 116, in accordance with embodiments of the present disclosure. In some embodiments, the architecture shown in FIG. 2 is that of an LR-DIMM. As shown in FIG. 2, memory module 116 may comprise a plurality of memory buffers 120 each communicatively coupled to memory controller 108 via front-side lanes 202. In multi-drop bus topologies, front-side lanes 202 may be one of signals from a multi-drop bus interface of memory controller 108. As also shown in FIG. 2, each memory buffer 120 may be communicatively coupled to a plurality of memory chips 110 via corresponding back-side lanes 204. In some embodiments, groups of data lanes and their associated strobes may commonly be referred to as a "data bundle" or "data group." Common widths for these data bundles are four, eight, or 16 bits of data plus strobe(s). In some embodiments, memory buffer 120 may support a plurality of data bundles on its front-side and back-side interfaces. In some embodiments, the number of front-side data bundles may match those on the back-side (e.g., a single data bundle eight bits wide). In other embodiments, the number of data bundles may differ from the front-side to the back-side (e.g., two eight-bit wide data bundles on the front-side and four four-bit data bundles on the back-side).

When implemented in actual chips, circuit boards, and other physical components, switching of front-side lanes 202 may cause crosstalk between itself and one or more other front-side lanes 202 due to physical proximity of the conductive elements making up front-side lanes 202. Thus, signal integrity of a front-side lane 202 may be affected by one or more other front-side lanes 202. To reduce or eliminate such crosstalk, memory controller 108 may perform data alignment techniques, such as those described with respect to FIG. 3 below.

FIG. 3 illustrates a flow chart of an example method 300 for data alignment in memory system 104, in accordance with embodiments of the present disclosure. According to some embodiments, method 300 may begin at step 302. As noted above, teachings of the present disclosure may be implemented in a variety of configurations of information handling system 102. As such, the preferred initialization point for method 300 and the order of the steps comprising method 300 may depend on the implementation chosen.

At step 302, in response to a power on or reset of information handling system 102, memory system 104 may initialize including initialization sequences of memory buffers 120 and memory chips 110.

At step 304, in order to optimize signal integrity of communication on back-side lanes 204, memory controller 108 may perform link training (e.g., write leveling, read leveling, read-eye training, write-eye training, etc.) on back-side lanes 204. At step 306, after optimal settings are found as a result of training of back-side lanes 204, memory controller 108 may perform link training (e.g., write leveling, read leveling, read-eye training, write-eye training, etc.) on front-side lanes 202. In some embodiments, the sequence of training calibrations of steps 304 and 306 may be performed as defined by the DDR4 JEDEC specification or other suitable specification, standard, or protocol. In addition, training algorithms for communication links of the various data lanes may be in accordance with methods now known or which may in the future be known in the art.

As training is performed on a per-memory buffer 120 basis at the granularity of the back-side and front-side data bundles, the front-side data bus between memory controller 108 and memory buffers 120 may be triggered at different times depending on the results of the training algorithms. Because the front-side data bus comprising front-side lanes 202 may be more heavily loaded than the back-side data bus comprising back-side lanes 204, controlling jitter and crosstalk noise on the front-side data bus may become essential to achieving higher speeds of operation. Two adjacent front-side data bundles (e.g., four-bit nibbles) which may each correspond to one or more respective back-side data bundles and coupled to a memory buffer 120 may be susceptible to coupling noise between each other because the time of launch may be different for the front-side bundles. Accordingly, at step 308, memory controller 108 may align data of the front-side lanes 202 of the front-side bundles at the expense of a shift in the launch of data communicated over back-side lanes 204 from the initial trained values. In these and other embodiments, it may be possible to adjust the propagation delays through memory buffer 120 to avoid the need to compromise front-side margin for back-side margin (or vice versa).

At step 310, memory controller 108 may determine if front-side lanes 202 have signal integrity exceeding one or more threshold levels (e.g., above threshold eye width and/or above threshold eye height). If signal integrity of the front-side lanes is sufficient, method 300 may end, and memory system 104 may begin normal operation. Otherwise, method 300 may proceed to step 312.

At step 312, in response to one or more of front-side lanes 202 having insufficient signal integrity, memory controller 108 may further optimize by modifying the timing of data on one or more of front-side lanes 202 and back-side lanes 204 in order that the overall margin on all of front-side lanes 202 and back-side lanes 204 is improved. For example, timing margin (e.g., eye width) and/or magnitude margin (e.g., eye height) may be taken away for data on one or more front-side lanes 202 in order to provide improved timing margin and/or magnitude margin on other front-side lanes 202. For example, this may be achieved by analyzing front-side lanes 202 having the lowest margins and modifying timing of one or more aggressor front-side lanes 202 of the front-side lanes 202 having the lowest margins in order to reduce crosstalk from the aggressors. To determine the aggressors for a particular front-side lane 202, timing of data of the potential aggressor front-side lanes 202 may be slowly modified and a sensitivity analysis performed. Various loops or nested loops may be used or other heuristics may be employed. In some instances, platform- and/or system-specific "hints" may also be included, for example as determine a priori via simulation and/or characterization in which "weaker" front-side lanes 202 and/or back-side lanes 204 are identified and/or which statistically-relevant data re-alignment directions are known. In another example, a database of lane-routing topologies, including per-lane adjacencies, may be made available to the training algorithm for help in determining likely aggressors and/or where capacitive coupling may be high, and used to optimize the training algorithms, loops, and/or trials. Data realignment may utilize features within DDR channel controllers, memory buffers 120, and/or memory chips 110, singly or in combination as suitable. After completion of step 312, method 300 may proceed again to step 310. In other embodiments, method 300 may proceed again to step 308 after completion of step 312.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using processor 103, memory controller 108, and/or any other system operable to implement method 300. In certain embodiments, method 300 may be implemented partially or fully in software and/or firmware embodied in computer-readable media.

In some alternate embodiments to that depicted in method 300, data realignment may be performed entirely within the front-side lanes 202 and back-side lanes 204 of each buffer 120. The realignment may be via programmable delays, utilizing different phases of the clocks or strobes, or by adjusting I/O cell parameters. In some embodiments, margin of back-side lanes 204 may be reduced in order to improve margin of front-side lanes 202 with respect to each individual memory buffer 120. In some embodiments, margin of front-side lanes 202 may be reduced in order to improve margin of back-side lanes 204 with respect to each individual memory buffer 120.

In these and other embodiments, after optimizing margin of front-side lanes 202 and back-side lanes 204 with respect to each buffer 120, the timing of buffer 120 to a different memory buffer 120 may be reduced or increased in order to optimize margin across memory buffers 120. The timing may be altered by utilizing adjustable propagation delay elements or other settings in memory buffer 120, or memory controller 108.

In these and other embodiments, it may be useful to align all data bundles such that they switch simultaneously and hence align all of the crosstalk in "crosstalk peaks". In other embodiments, it may be useful to distribute the data bundles in time such that they switch with a minimum of overall data-bundle-to-data-bundle overlap to minimize the "crosstalk peaks".

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
    a first device; and
    a second device communicatively coupled to the first device; and
    a plurality of buffers communicatively coupled to the second device via a plurality of back-side lanes and communicatively coupled to the first device via a plurality of front-side lanes;
    wherein at least one of the first device and the second device is configured to, alone or in concert with the other:
        link train the back-side lanes;
        link train the front-side lanes;
        determine after link training of the back-side lanes and the front-side lanes whether signal integrity of data communicated over each of the front-side lanes exceeds one or more thresholds; and
        responsive to determining that the signal integrity of data communicated over one or more of the front-side lanes fails to exceed the one or more thresholds, modify timing of data communicated over one or more of the back-side lanes and the front-side lanes in order to improve signal integrity of the one or more of the front-side lanes failing to exceed the one or more thresholds.

2. The system of claim 1, wherein at least one of the first device and the second device is further configured to, alone or in concert with the other:
    identify one or more aggressor lanes for the one or more front-side lanes failing to exceed the one or more thresholds; and
    modify timing of data in the one or more aggressor lanes in order to improve signal integrity of one or more of the one or more front-side lanes failing to exceed the one or more thresholds.

3. The system of claim 1, wherein the second device is coupled to the first device via a multi-drop bus.

4. The system of claim 1, wherein a bit width of the front-side lanes is greater than a bit width of the back-side lanes.

5. The system of claim 4, wherein the bit width of the front-side lanes is twice than the bit width of the back-side lanes.

6. A method comprising:
    link training a plurality of back-side lanes communicatively coupling a first device to a memory module to a plurality of data buffers integral to the memory module;
    link training a plurality of front-side lanes communicatively coupling the plurality of data buffers to a second device;
    determining after link training of the back-side lanes and the front-side lanes whether signal integrity of data communicated over each of the front-side lanes exceeds one or more thresholds; and
    responsive to determining that the signal integrity of data communicated over one or more of the front-side lanes fails to exceed the one or more thresholds, modifying timing of data communicated over one or more of the back-side lanes and the front-side lanes in order to improve signal integrity of the one or more of the front-side lanes failing to exceed the one or more thresholds.

7. The method of claim 6, further comprising:
    identifying one or more aggressor lanes for the one or more front-side lanes failing to exceed the one or more thresholds; and
    modifying timing of data in the one or more aggressor lanes in order to improve signal integrity of one or more of the one or more front-side lanes failing to exceed the one or more thresholds.

8. The method of claim 6, wherein the first device is coupled to the second device via a multi-drop bus.

9. The method of claim 6, wherein a bit width of the front-side lanes is greater than a bit width of the back-side lanes.

10. The method of claim 9, wherein the bit width of the front-side lanes is twice than the bit width of the back-side lanes.

11. An information handing system, comprising:
    a processor; and
    a system comprising:
        a first device; and
        a second device communicatively coupled to the first device; and
        a plurality of buffers communicatively coupled to the second device via a plurality of back-side lanes and communicatively coupled to the first device via a plurality of front-side lanes;
        wherein at least one of the first device and the second device is configured to, alone or in concert with the other:
            link train the back-side lanes;
            link train the front-side lanes;
            determine after link training of the back-side lanes and the front-side lanes whether signal integrity of data communicated over each of the front-side lanes exceeds one or more thresholds; and
            responsive to determining that the signal integrity of data communicated over one or more of the front-side lanes fails to exceed the one or more thresholds, modify timing of data communicated over one or more of the back-side lanes and the front-side lanes in order to improve signal integrity of the one or more of the front-side lanes failing to exceed the one or more thresholds.

12. The information handling system of claim 11, wherein at least one of the first device and the second device is further configured to, alone or in concert with the other:
    identify one or more aggressor lanes for the one or more front-side lanes failing to exceed the one or more thresholds; and
    modify timing of data in the one or more aggressor lanes in order to improve signal integrity of one or more of the one or more front-side lanes failing to exceed the one or more thresholds.

13. The information handling system of claim 11, wherein the first device is coupled to the second device via a multi-drop bus.

14. The information handling system of claim 11, wherein a bit width of the front-side lanes is greater than a bit width of the back-side lanes.

15. The information handling system of claim 11, wherein the bit width of the front-side lanes is twice than the bit width of the back-side lanes.

* * * * *